(12) United States Patent
Simpson et al.

(10) Patent No.: US 11,768,240 B2
(45) Date of Patent: Sep. 26, 2023

(54) RE-PROGRAMMABLE SELF-TEST

(71) Applicant: TEXAS INSTRUMENTS INCORPORATED, Dallas, TX (US)

(72) Inventors: Neil John Simpson, Rockwall, TX (US); Alan David Hales, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/371,464

(22) Filed: Jul. 9, 2021

(65) Prior Publication Data

US 2021/0333324 A1     Oct. 28, 2021

Related U.S. Application Data

(63) Continuation of application No. 16/371,316, filed on Apr. 1, 2019, now Pat. No. 11,092,650, which is a continuation of application No. 15/666,789, filed on Aug. 2, 2017, now Pat. No. 10,247,780.

(51) Int. Cl.

| | | |
|---|---|---|
| *G01R 31/00* | (2006.01) | |
| *G01R 31/3187* | (2006.01) | |
| *G01R 31/3183* | (2006.01) | |
| *G01R 31/317* | (2006.01) | |
| *G11C 29/12* | (2006.01) | |
| *G11C 29/10* | (2006.01) | |
| *G11C 29/36* | (2006.01) | |

(52) U.S. Cl.
CPC ..... *G01R 31/3187* (2013.01); *G01R 31/3183* (2013.01); *G01R 31/31724* (2013.01); *G01R 31/318335* (2013.01); *G01R 31/318385* (2013.01); *G11C 29/10* (2013.01); *G11C 29/12* (2013.01); *G11C 29/36* (2013.01); *G11C 2029/3602* (2013.01)

(58) Field of Classification Search
CPC .......... G01R 31/3187; G01R 31/31724; G01R 31/3183; G01R 31/318335; G01R 31/318385; G11C 29/12; G11C 29/10; G11C 29/36; G11C 2029/3602
USPC .......................... 714/715, 726, 728, 733, 742
See application file for complete search history.

(56) References Cited

U.S. PATENT DOCUMENTS

| | | | |
|---|---|---|---|
| 5,572,712 A | 11/1996 | Jamal | |
| 6,684,358 B1 | 1/2004 | Rajski et al. | |
| 7,093,175 B2 * | 8/2006 | Rajski ............ | G01R 31/318547 714/739 |
| 7,603,603 B2 | 10/2009 | Dubey | |

(Continued)

*Primary Examiner* — Albert Decady
*Assistant Examiner* — Osman M Alshack
(74) *Attorney, Agent, or Firm* — Carl G. Peterson; Frank D. Cimino

(57) ABSTRACT

A built-in self-test (BIST) method includes providing expanded test patterns to a logic circuit under test, generating a first signature based on a response of the logic circuit to the expanded test patterns, generating a second signature based on the first signature, wherein the second signature is a compressed version of the first signature, selecting one of the first signature or the second signature in response to a control signal, comparing the selected one of the first signature or the second signature to an expected signature, and, based on the comparison of the selected one of the first signature or the second signature to the expected signature, determining that the logic circuit passes or fails BIST.

11 Claims, 3 Drawing Sheets

(56) References Cited

U.S. PATENT DOCUMENTS

| | | | |
|---|---|---|---|
| 9,704,599 B1* | 7/2017 | Katoch | G11C 29/28 |
| 10,078,114 B2 | 9/2018 | Iwata et al. | |
| 2003/0229838 A1* | 12/2003 | Hiraide | G01R 31/318547 |
| | | | 714/738 |
| 2004/0064771 A1 | 4/2004 | Appinger et al. | |
| 2005/0060625 A1* | 3/2005 | Wang | G01R 31/318536 |
| | | | 714/727 |
| 2006/0015787 A1 | 1/2006 | Wang et al. | |
| 2007/0033468 A1 | 2/2007 | Hilgendorf et al. | |
| 2009/0172488 A1* | 7/2009 | Hasegawa | G01R 31/318533 |
| | | | 714/733 |
| 2010/0100781 A1* | 4/2010 | Wohl | G01R 31/318547 |
| | | | 714/728 |
| 2011/0029813 A1 | 2/2011 | Gunderson et al. | |
| 2011/0238878 A1 | 9/2011 | Welguisz et al. | |
| 2011/0239070 A1* | 9/2011 | Morrison | G06F 11/2236 |
| | | | 714/E11.155 |
| 2011/0307750 A1* | 12/2011 | Narayanan | G01R 31/3177 |
| | | | 714/E11.055 |
| 2013/0051158 A1 | 2/2013 | Matsuo | |
| 2014/0006889 A1* | 1/2014 | Motika | G06F 11/27 |
| | | | 714/E11.155 |
| 2014/0053035 A1 | 2/2014 | Harper et al. | |
| 2014/0082453 A1 | 3/2014 | Sikdar et al. | |
| 2016/0245863 A1 | 8/2016 | Mrugalski et al. | |
| 2017/0363685 A1 | 12/2017 | Douskey et al. | |
| 2018/0067164 A1* | 3/2018 | Maheshwari | G01R 31/31725 |
| 2018/0090225 A1* | 3/2018 | Maeda | G11C 29/52 |
| 2018/0156867 A1* | 6/2018 | Rajski | G01R 31/318563 |
| 2018/0284192 A1* | 10/2018 | Kumar | G06F 11/25 |

\* cited by examiner

RE-PROGRAMMABLE SELF-TEST

CROSS-REFERENCE TO RELATED APPLICATION(S)

This application is a continuation of U.S. patent application Ser. No. 16/371,316 filed on Apr. 1, 2019, now U.S. Pat. No. 11,092,650, which is a continuation of U.S. patent application Ser. No. 15/666,789 filed on Aug. 2, 2017, now U.S. Pat. No. 10,247,780, both of the entireties of which are incorporated herein by reference.

TECHNICAL FIELD

The technical field of this disclosure relates to built-in self-test (BIST).

BACKGROUND

Today's Systems on a Chip (SoC) have very high level of integration with multiple voltage regulators, voltage monitors, analog to digital and digital to analog converters, power on reset controllers and other systems which significantly increase the scope and complexity of manufacturing test coverage as well as the cost of testing.

During its lifetime, a digital system is tested and diagnosed on numerous occasions. For the system to perform its intended mission with high availability, testing and diagnosis must be quick and effective. A sensible way to ensure this is to specify test as one of the system functions-in other words, self-test.

Digital systems involve a hierarchy of parts: chips, boards, cabinets, and so on. At the highest level, which may include the entire system, the operation is controlled by software. Self-test is often implemented in software. While a purely software approach to self-test may suffice at the system level, it has several disadvantages. Such testing may have poor diagnostic resolution because it must test parts designed without specific testability considerations. In addition, a good software test can be very long, slow, and expensive to develop.

An attractive alternative is built-in self-test, (BIST) that is, self-test implemented in hardware.

The basic BIST architecture requires the addition of three hardware modules to a digital circuit: a pattern generator; a response analyzer; and a test controller.

Examples of pattern generators are a ROM with stored patterns, a counter, or a linear feedback shift register (LFSR). A typical response analyzer is a comparator with stored responses or a signature analyzer. The signature analyzer may be implemented in a number of ways known in the art, with the most common being a Multiple Input Shift Register (MISR).

A control module is usually required to activate the test and analyze the responses.

SUMMARY

Self-test solutions have been well known for many years, but they have always been limited by the fixed nature of the coverage that can be achieved. Including the re-programmability option shown in this invention through employing a one time programmable eFuse for the Pseudo Random Pattern Generator (PRPG) seed data input and the Multiple Input Shift Register (MISR) signature output comparison, provides an enhanced capability to increase the coverage of the self-test solution after manufacture.

BRIEF DESCRIPTION OF THE DRAWINGS

These and other aspects of this invention are illustrated in the drawings, in which.

DETAILED DESCRIPTION

Figure 1:
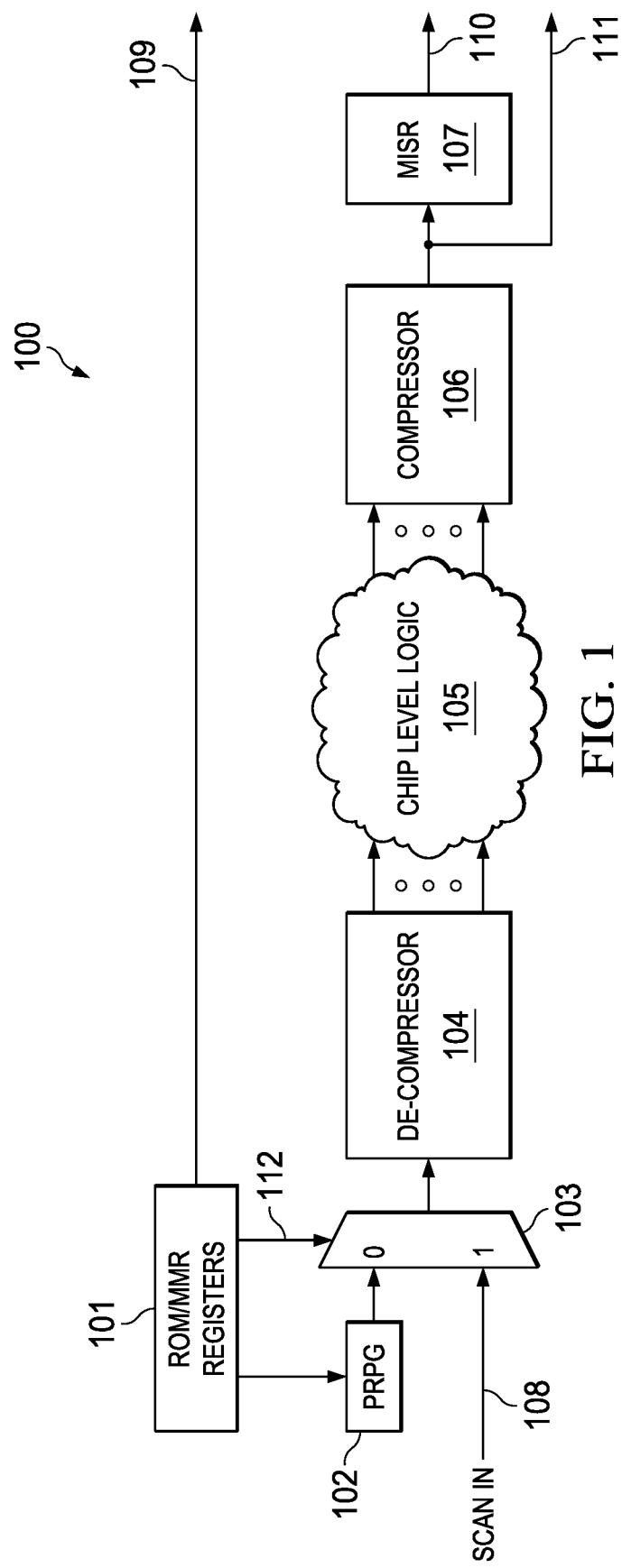
FIG. 1 shows a BIST circuit as implemented in the prior art.

FIG. 1 shows an implementation of a BIST circuit as known in the prior art. Test patterns are generated by a PRPG 102 that may be implemented in various ways known in the art, but usually as an LFSR that generates a pseudo random sequence starting from a given initial seed. Seeds for the PRPG 102 and the corresponding MISR signatures are stored in read only memory/memory mapped register file 101. The seeds are provided to PRPG 102. The output of PRPG 102 is connected to a first input of selector 103. Selector 103 is operable to select either the output of PRPG 102, or an external scan input signal 108, dependent upon the state of control signal 112. The output of selector 103 is connected to de-compressor/expander 104. This module expands the input pattern using several possible, symmetrical methods known in the art such as a Linear Feedback Shift Register (LFSR), and connects the expanded output to the circuit under test 105. The resulting output of circuit under test 105 is connected to compressor 106 which compresses the output data using the reverse of the method that was used in de-compressor/expander 104, typically using an LFSR. The output of compressor 106 is provided to optional external test equipment on scan output line 111, and to the input of MISR module 107. The output of MISR module 107 is the signature of the test result. This result is provided to an external comparator via line 110, to be compared to the expected output provided from module 101 on line 109. Depending on the implementation, compressor 106 and MISR module 107 may be combined into one circuit module.

Figure 2:
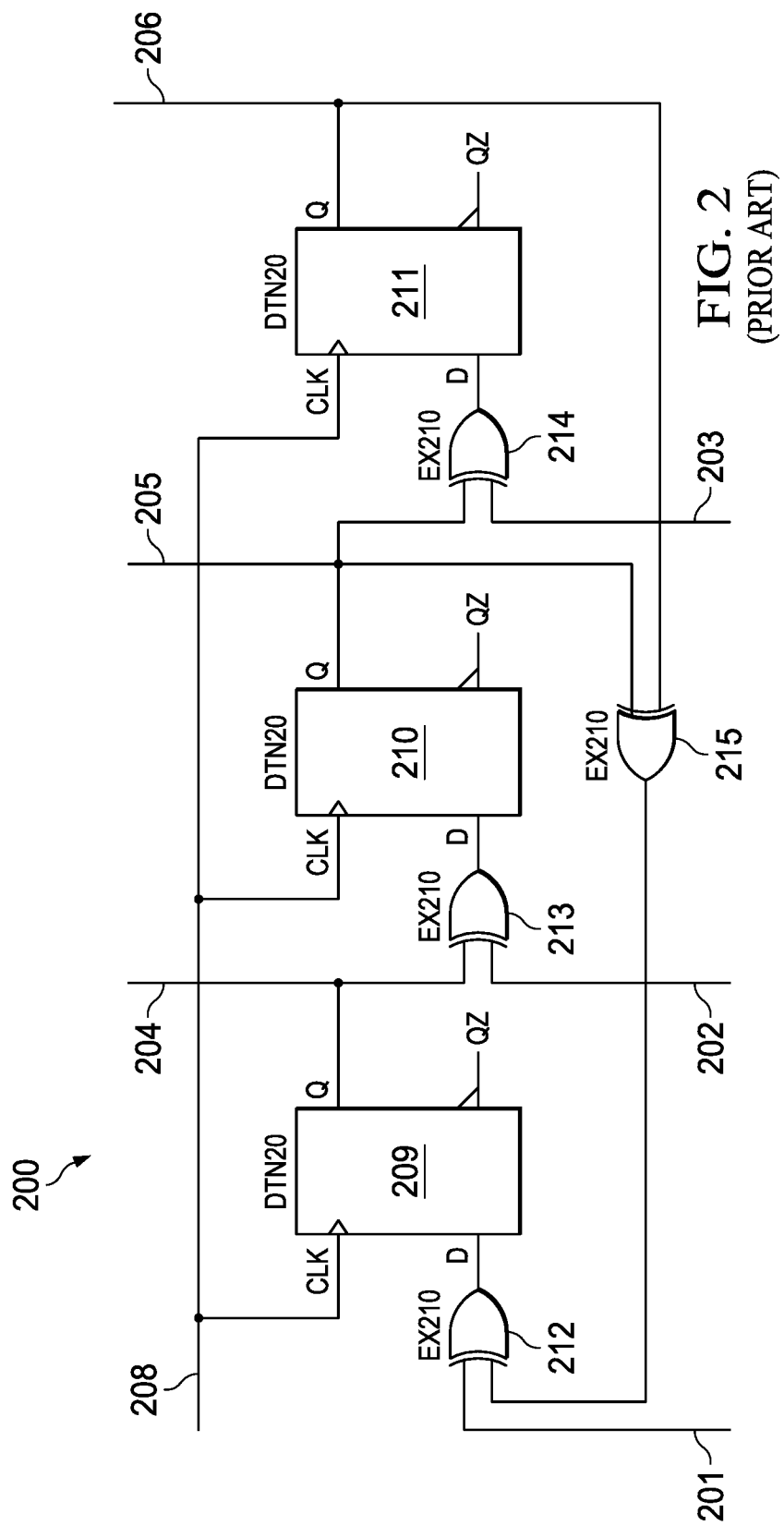
FIG. 2 shows a MISR circuit of the prior art.

FIG. 2 shows an exemplary implementation of a 3 stage LFSR. This is well known in the art, and may be used in the PRPG 102, MISR module 107, decompressor/expander 104 and compressor 106.

As shown in 200, the LFSR consists of a plurality of flip/flop register circuits 209, 210 and 211, and feedback gates 212, 213, 214 and 215. The number of flip/flop circuit stages in an implementation is dependent on the application. If the application is a PRPG, the number of stages determines the length of the pseudo random sequence before repeating. In this application, the seed, or starting point of the sequence is input on lines 201, 202 and 203 to respective XOR gates 212, 213 and 214. When the LFSR is clocked on line 208, a new member of the pseudo random sequence is output on lines 204, 205 and 206 on every clock transition.

If the application is decompression or expansion, the initial pattern is input to XOR gates 212, 213 and 214, and the output from lines 204, 205 and 206 are used as the test stimulus to the circuit under test. For each pattern input, the LFSR is clocked a plurality of times thus generating a plurality of test patterns based on each instance of the input pattern. In this application, the number of stages is dependent upon the number of test stimuli needed for the particular circuit being tested.

The compressor and MISR functions may be combined in one function, and are essentially the reverse of the de-compressor function, with the same number of stages as the compressor. The signature representing the results of the test is recovered after the same number of clock transitions in the compressor as was employed in the de-compressor.

Figure 3:
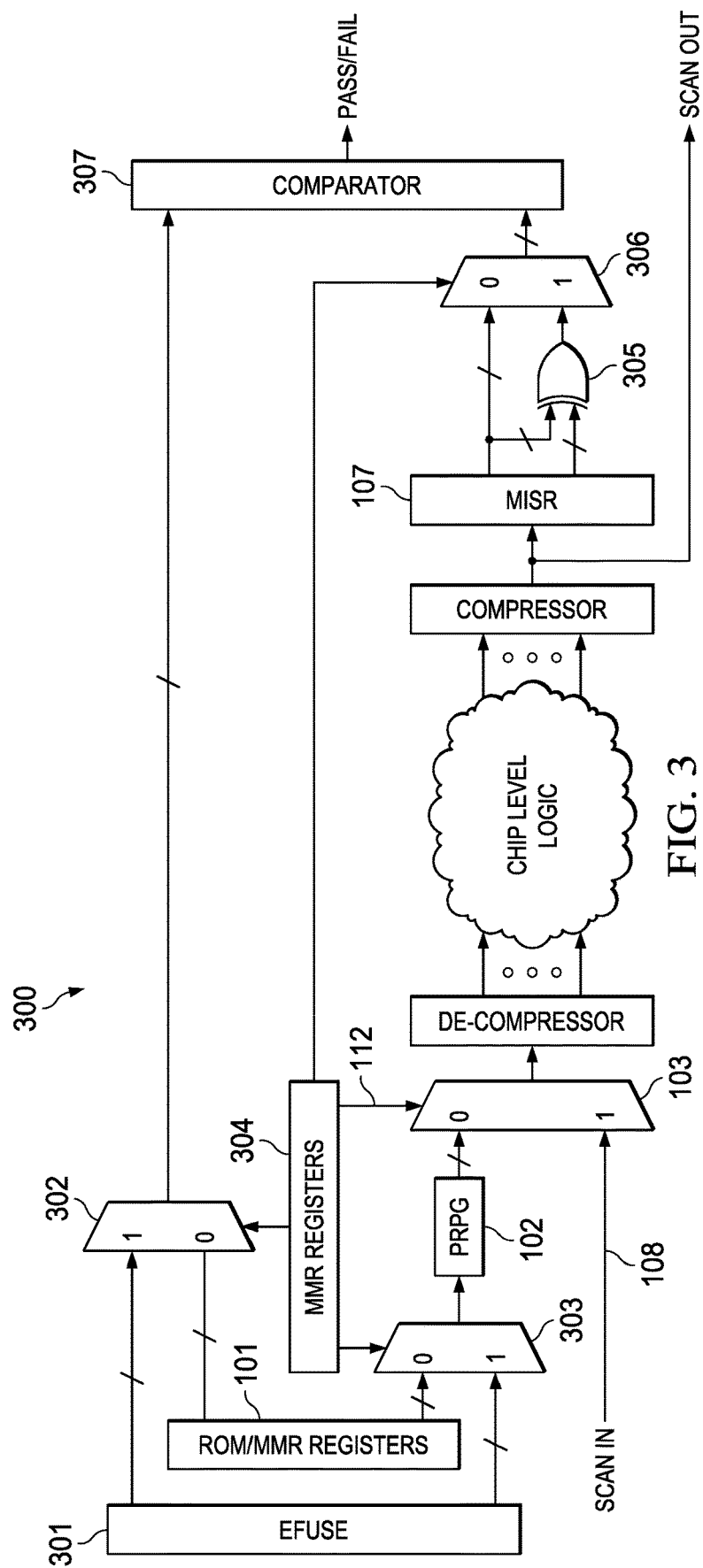
FIG. 3 shows the BIST circuit of this invention.

FIG. 3 shows the BIST circuit of the invention. The eFuse module 301 is one time programmable to hold additional seed values for the PRPG 102 and additional expected signature data corresponding to the new seeds. A first output of eFuse module 301 is connected to a first input of selector 303 to provide seed data stored in eFuse module 301 to the selector 303. A second input of selector 303 is connected to the seed output port of ROM/register bank 101. The control input of selector 303 is connected to an output from MMR control register bank 304, and the output of selector 303 is connected to PRPG 102. Selector 303 thus controls the source of the seed being used by PRPG 102. MMR control register bank 304 controls selectors 302, 303 and 306.

The first output of MISR module 107 is connected to the first input of selector 306, and to the first input of XOR module 305. The second output of MISR module 107 is connected to the second input of XOR module 305. The output of XOR module 305 is connected to the second input of selector 306. Selector 306 is controlled by an output from MMR control register bank 304 and is operable to select whether the output of selector 306 is the signature from MISR module 107, or is a further modified signature from XOR module 305. XOR module 305 further compresses the signature by masking off non-applicable parts of the signature.

The output of selector 306 is connected to a first input of comparator 307. A second input of comparator 307 is connected the output of selector 302. The output of comparator 307 is the pass/fail indication of the BIST.

The first input of selector 302 is connected to a second output of eFuse 301, and the second input of selector 302 is connected to the second (signature) output port of ROM/Register bank 101. Selector 302 thus, depending on the state of the control signal from MMR control register bank 304, selects whether the signature input to comparator 307 originates from the eFuse module 301 or from the ROM/Register module 101.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An apparatus comprising:
   a compressor including a test result input and a compressed test result output;
   a shift register including a shift register input, a first shift register output, and a second shift register output, the shift register input coupled to the compressed test result output;
   an exclusive or (XOR) logic including a first input, a second input, and a XOR output, the first input coupled to the first shift register output, the second input coupled to the second shift register output;
   a selector including a first selector input, a second selector input, a selector control input, and a selector output, the first selector input coupled to the first shift register output, the second selector input coupled to the XOR output; and
   a comparator including a first comparator input, and a second comparator input, the first comparator input coupled to the selector output, the second comparator input coupled to an expected signature output.

2. The apparatus of claim 1, wherein:
   the selector control input is coupled to an output of a register bank.

3. The apparatus of claim 2, wherein:
   a control signal on the output of the register bank corresponds to a seed value associated with a test pattern.

4. The apparatus of claim 3, wherein:
   the expected signature output corresponds to the seed value.

5. The apparatus of claim 2, further including:
   a memory selector including a memory selector control input, a first memory selector input, and a second memory selector input, the memory selector control input coupled to the output of the register bank, the first memory selector input coupled to a first memory, the second memory selector input coupled to a second memory.

6. The apparatus of claim 5, wherein:
   the first memory includes at least one of a read-only memory or a memory mapped register file; and
   the second memory includes a one-time programmable (OTP) memory.

7. The apparatus of claim 6, wherein:
   the OTP memory is an eFuse device.

8. The apparatus of claim 2, further including:
   a test pattern source selector including a test pattern source selector control input, a first test pattern source selector input, a second test pattern source selector input, and a test pattern source selector output, the test pattern source selector control input coupled to the output of the register bank, the first test pattern source selector input coupled to a first test pattern source, the second test pattern source selector input coupled to a second test pattern source.

9. The apparatus of claim 8, wherein:
   the first test pattern source is based on a seed value; and
   the second test pattern source is coupled to an external signal to the apparatus.

10. The apparatus of claim 8, further including:
    a decompressor including a decompressor input and a decompressor output, the decompressor input coupled to the test pattern source selector output.

11. The apparatus of claim 10, wherein:
the decompressor output is configured to be coupled to an input of a logic circuit; and
the test result input is configured to be coupled to an output of the logic circuit.

\* \* \* \* \*